(12) United States Patent
Kim et al.

(10) Patent No.: US 7,416,997 B2
(45) Date of Patent: Aug. 26, 2008

(54) METHOD OF FABRICATING SEMICONDUCTOR DEVICE INCLUDING REMOVING IMPURITIES FROM SILICON NITRIDE LAYER

(75) Inventors: Kyong-Min Kim, Ansan-si (KR); Sang-Kyu Park, Suwon-si (KR); Sang-Woon Kim, Suwon-si (KR); Jae-Hwan Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 261 days.

(21) Appl. No.: 11/281,177

(22) Filed: Nov. 17, 2005

(65) Prior Publication Data

US 2006/0160358 A1 Jul. 20, 2006

(30) Foreign Application Priority Data

Jan. 18, 2005 (KR) ............... 10-2005-0004733

(51) Int. Cl.
*H01L 21/31* (2006.01)

(52) U.S. Cl. ................ 438/791; 438/794

(58) Field of Classification Search .......... 438/660, 438/778, 791, 792, 793, 794
See application file for complete search history.

(56) References Cited

U.S. PATENT DOCUMENTS

| 5,874,368 A | 2/1999 | Laxman et al. ......... 438/794 |
| 6,515,350 B1 | 2/2003 | Moore ................. 257/640 |
| 2003/0092285 A1* | 5/2003 | Hinoue et al. ......... 438/770 |
| 2005/0059260 A1* | 3/2005 | Bu et al. ............. 438/775 |

FOREIGN PATENT DOCUMENTS

| JP | 2004-266158 | 9/2004 |
| KR | 2001-0050379 | 6/2001 |

* cited by examiner

*Primary Examiner*—Kevin M Picardat
(74) *Attorney, Agent, or Firm*—F. Chau & Associates, LLC

(57) ABSTRACT

A method of fabricating a semiconductor device having a silicon nitride layer substantially free of impurities includes forming a silicon nitride layer on a semiconductor substrate and annealing the semiconductor substrate having the silicon nitride layer in an atmosphere of ammonia ($NH_3$) gas to remove impurities from the silicon nitride layer. The silicon nitride layer may be formed using BTBAS as a silicon precursor.

19 Claims, 4 Drawing Sheets

METHOD OF FABRICATING SEMICONDUCTOR DEVICE INCLUDING REMOVING IMPURITIES FROM SILICON NITRIDE LAYER

CROSS-REFERENCE TO RELATED APPLICATION

This application claims priority to Korean Patent Application No. 2005-0004733, filed on Jan. 18, 2005, the disclosure of which is herein incorporated by reference in its entirety.

BACKGROUND OF THE INVENTION

1. Field of the Invention

The present invention relates to a method of fabricating a semiconductor device, and more particularly to a method of fabricating a semiconductor device including removing impurities from a silicon nitride layer.

2. Discussion of the Related Art

Semiconductor device fabrication includes processes for forming thin films such as a conductive layer or an insulating layer. Silicon nitride is commonly used in semiconductor fabrication. For example, a silicon nitride layer can be applied as a hard mask layer in patterning thin films by photolithography and anisotropic etching. In addition, silicon nitride can be used for a passivation layer, an oxidation barrier layer, an etch stop layer or a gate spacer of a MOS transistor.

The silicon nitride layer can be formed by a chemical vapor deposition (CVD) process using a reaction of dichlorosilane (DCS; $SiCl_2H_2$) gas and ammonia ($NH_3$) gas. However, the CVD process using DCS gas as a silicon source requires that the silicon nitride layer be formed at a high temperature, e.g., 700° C. to 800° C. The high-temperature processing can cause abnormal diffusion of impurity ions in the semiconductor substrate, degrading device performance. Furthermore, the ammonium chloride ($NH_4Cl$) generated as a reaction by-product corrodes the metal parts of a process chamber, resulting in metal contaminants on the semiconductor substrate. In semiconductor device fabrication, it is desirable that particles and contaminants be minimized.

A silicon nitride layer can be formed using BisTertiaryButylAminoSilane (BTBAS; $C_8H_{22}N_2Si$) as a precursor. Since the silicon nitride layer can be formed at a lower temperature of about 600° C. using BTBAS, the problems caused by high-temperature processing can be avoided, and undesirable reaction by-products such as ammonium chloride can be prevented. Examples of methods of forming a silicon nitride layer using BTBAS are disclosed in U.S. Pat. Nos. 5,874,368 and 6,515,350.

However, BTBAS includes a large amount of carbon and hydrogen. As a result, the silicon nitride layer formed using BTBAS as a silicon precursor may contain a large amount of impurities in the form of carbon and hydrogen. In particular, the carbon impurities may deteriorate the dielectric characteristic of the silicon nitride layer. In the case that the silicon nitride layer formed using BTBAS is used as a gate spacer of a MOS transistor, the carbon impurities can penetrate into a gate insulating layer of the MOS transistor, deteriorating electrical characteristics of the device.

SUMMARY OF THE INVENTION

Exemplary embodiments of the present invention provide a method of fabricating a semiconductor device including removing impurities from a silicon nitride layer.

An exemplary embodiment of the present invention provides a method of fabricating a semiconductor device having a silicon nitride layer substantially free of impurities. The method includes forming a silicon nitride layer on a semiconductor substrate and annealing the semiconductor substrate having the silicon nitride layer in an atmosphere of ammonia ($NH_3$) gas to remove impurities from the silicon nitride layer.

In exemplary embodiments of the present invention, the silicon nitride layer may be formed using BTBAS as a precursor.

In exemplary embodiments of the present invention, annealing may be performed at a temperature of about 600° C. to about 700° C. The annealing process may be performed using a rapid thermal process (RTP) apparatus for about 10 seconds to about 60 seconds. During the annealing process, the ammonia gas may be flowed over the semiconductor substrate at a flow rate of about 20 sccm to about 100 sccm.

In exemplary embodiments, forming the silicon nitride layer and annealing the semiconductor substrate may be performed in-situ.

In exemplary embodiments of the present invention, the steps of forming the silicon nitride layer and annealing the semiconductor substrate may be repeated at least one time. The silicon nitride layer may be formed to a thickness of about 50 Å to about 300 Å.

In accordance with another exemplary embodiment of the present invention, a method of fabricating a semiconductor device includes forming a gate pattern on a semiconductor substrate. A silicon nitride layer is formed to conformally cover the semiconductor substrate having the gate pattern. Annealing is performed on the semiconductor substrate having the silicon nitride layer in an atmosphere of ammonia ($NH_3$) gas to remove impurities from the silicon nitride layer. The silicon nitride layer is anisotropically etched, forming a nitride layer spacer on sidewalls of the gate pattern.

In exemplary embodiments of the present invention, forming the silicon nitride layer and annealing the semiconductor substrate may be performed in-situ.

In exemplary embodiments of the present invention, before forming the nitride layer spacer, the steps of forming the silicon nitride layer and annealing the semiconductor substrate may be repeated at least one time. The silicon nitride layer may be formed to have a thickness of about 50 Å to about 300 Å.

In exemplary embodiments of the present invention, before forming the silicon nitride layer, a silicon oxide layer may be formed to conformally cover the semiconductor substrate having the gate pattern. The silicon nitride layer may be conformally formed on the silicon oxide layer.

In exemplary embodiments of the present invention, before forming the silicon oxide layer, impurity ions may be implanted into the semiconductor substrate using the gate pattern as an ion implantation mask, forming low concentration impurity regions. After forming the nitride layer spacer, impurity ions may be implanted into the semiconductor substrate using the gate pattern and the nitride layer spacer as ion implantation masks, forming source/drain regions.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1:
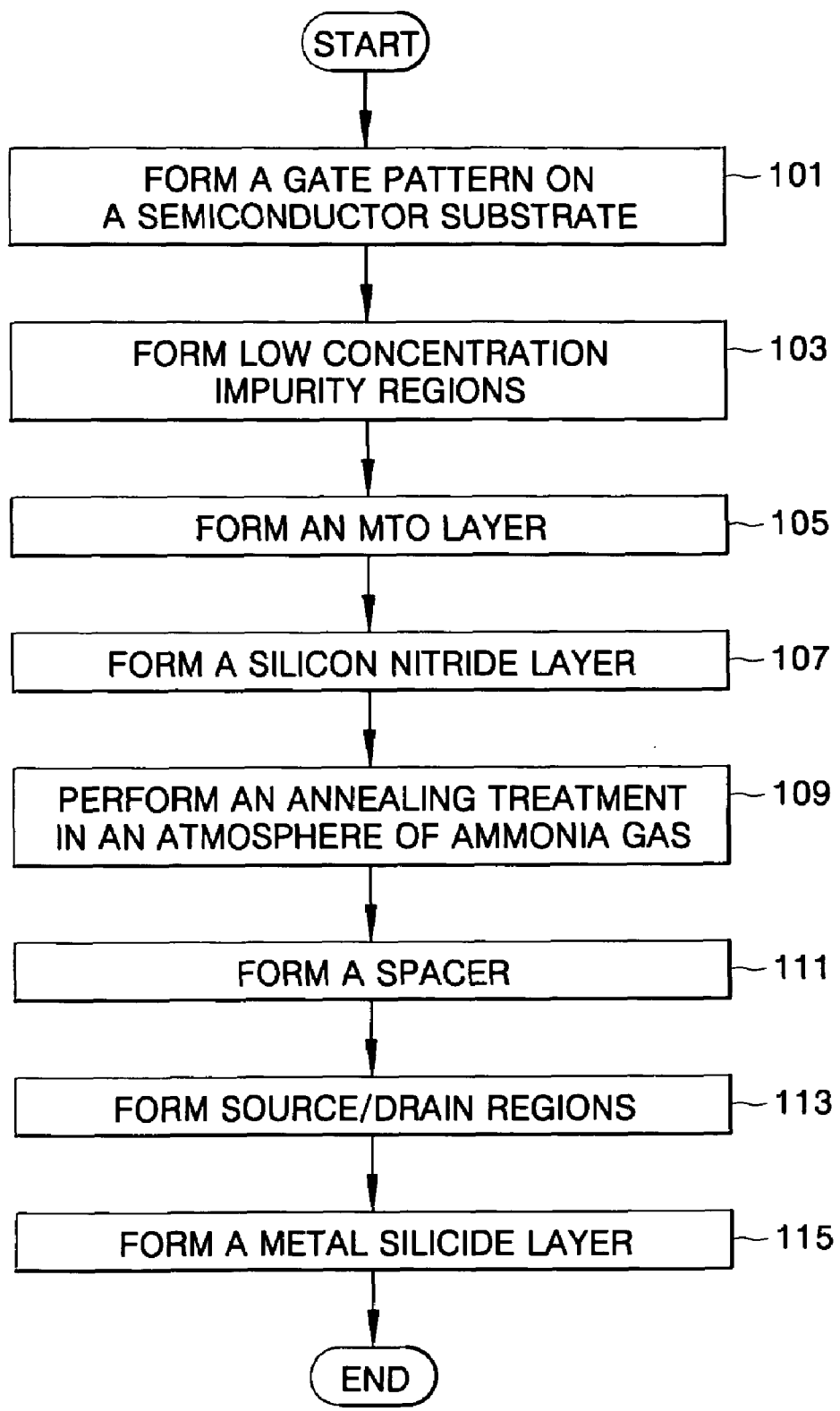
FIG. 1 is a process flow chart illustrating a method of fabricating a MOS transistor according to exemplary embodiments of the present invention.

Hereinafter, the exemplary embodiments of the present invention will be described in detail with reference to the accompanying drawings. In the drawings, the size and relative sizes of layers and regions may be exaggerated for clarity. Like numbers refer to similar or identical elements throughout the description of the figures.

FIG. 1 is a process flow chart illustrating a method of fabricating a MOS transistor according to exemplary embodiments of the present invention, and FIGS. 2 to 6 are sectional views illustrating a method of fabricating a MOS transistor according to exemplary embodiments of the present invention.

Figure 2:
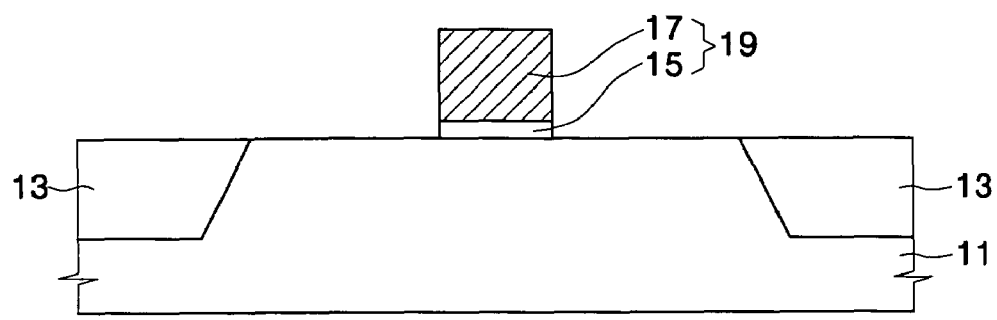
FIGS. 2 to 6 are sectional views illustrating a method of fabricating a MOS transistor according to exemplary embodiments of the present invention.

Referring to FIGS. 1 and 2, an isolation layer 13 is formed to define an active region in a semiconductor substrate 11. The isolation layer 13 may be formed using a shallow trench isolation (STI) process. It will be understood that any means for forming the isolation layer 13 should be suitable for implementing the invention. In a step 101, a gate pattern 19 is formed on the semiconductor substrate 11. In an embodiment of the present invention, forming the gate pattern 19 on the semiconductor substrate 11 includes forming a gate insulating layer 15 on the active region defined by the isolation layer 13. A gate conductive layer is formed on the semiconductor substrate 11 having the gate insulating layer 15. For example, the gate conductive layer may be formed of an amorphous silicon layer or a polysilicon layer. The gate conductive layer is patterned, forming a gate electrode 17 extending across over the active region. The gate insulating layer 15 is etched, exposing the surface of the active region of the semiconductor substrate 11, which is adjacent to the gate electrode 17. The gate insulating layer 15 and the gate electrode 17 comprise the gate pattern 19.

Figure 3:
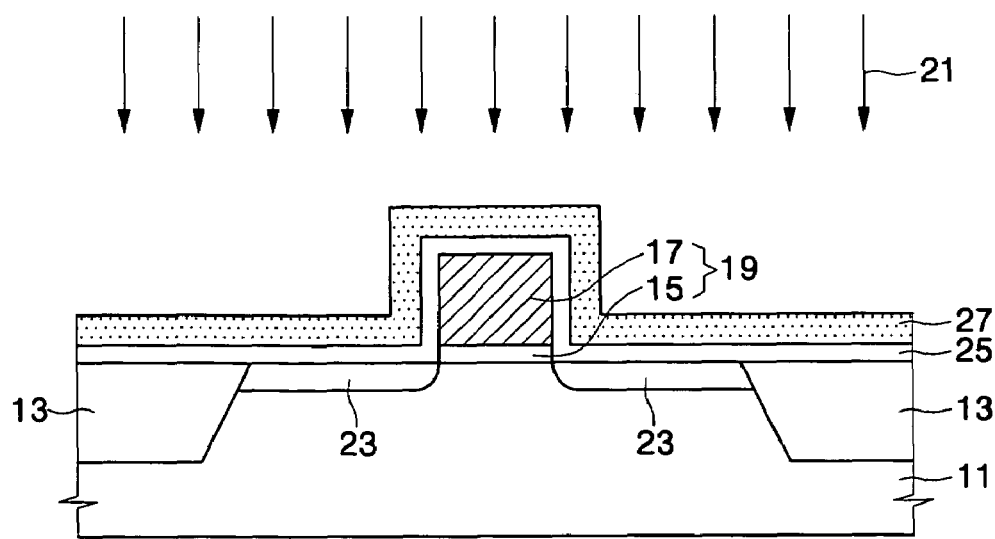
Figure 4:
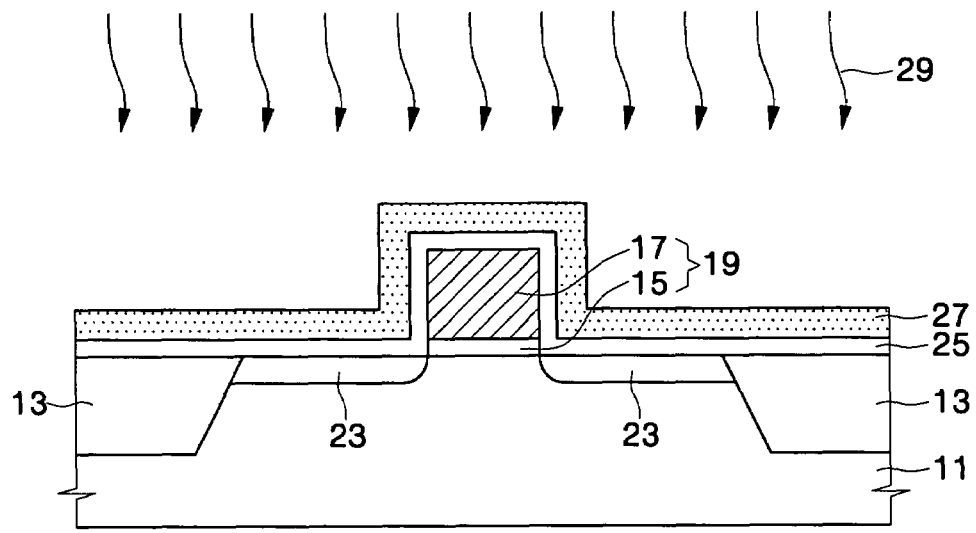

Referring to FIGS. 1 and 3, in a step 103, first impurity ions 21 are implanted into the semiconductor substrate 11, using the gate pattern 19 as an ion implantation mask, forming low concentration impurity regions 23 in the semiconductor substrate 11 adjacent to the gate pattern 19. The first impurity ions 21 may have a conductivity type opposite to that of the semiconductor substrate 11. For example, if the semiconductor substrate 11 is a P-type semiconductor substrate, the first impurity ions 21 may be N-type impurity ions.

In a step 105, a silicon oxide layer 25 may be conformally formed on the overall surface of the semiconductor substrate 11. The silicon oxide layer 25 may be a medium-temperature silicon oxide (MTO) layer, which can be formed at a temperature of about 650° C. to about 750° C. In one embodiment, the MTO layer may be formed by injecting $SiH_4$ and $N_2O$ as reaction gases into a chamber at flow rates of about 30 slm to about 60 slm and about 1 slm to about 10 slm respectively. At this time, a temperature of the semiconductor substrate 11 may be maintained about 740° C., and a pressure of the deposition chamber may be maintained about 107 Pa. The MTO layer may be formed to a thickness of about 100 Å to about 200 Å.

In a step 107, a silicon nitride layer 27 is conformally formed on the silicon oxide layer 25. The silicon nitride layer 27 may be formed using BTBAS as silicon precursor, and using ammonia gas as reaction gas. In one embodiment of the present invention, the BTBAS in a canister of a bubbler is heated up to a temperature of about 65° C. to 80° C. to evaporate. Then, a carrier gas such as nitrogen ($N_2$) is used to inject the evaporated BTBAS gas into the deposition chamber. In the case that the carrier gas is nitrogen, the nitrogen gas may be injected into the deposition chamber at a flow rate of about 100 sccm to 300 sccm. While the evaporated BTBAS is injected into the deposition chamber, the ammonia gas may be injected into the deposition chamber at a flow rate of about 100 sccm to about 1000 sccm. Further, while the BTBAS and the ammonia gas are injected, a temperature of the semiconductor substrate 11 can be maintained at about 500° C. to about 600° C.

In a step 109, the semiconductor substrate having the silicon nitride layer 27 formed thereon is annealed 29 in an atmosphere of ammonia gas. The annealing 29 is preferably performed using a rapid thermal process (RTP) apparatus to reduce a thermal budget. For example, annealing 29 can be performed at a temperature of about 600° C. to about 700° C. for about 10 seconds to about 60 seconds. Further, the ammonia gas can be flowed over the semiconductor substrate having the silicon nitride layer 27 at a flow rate of about 20 sccm to about 100 sccm during annealing 29. The silicon nitride layer 27 formed using the BTBAS as a silicon precursor may contain a large amount of undesired impurities such as carbon or hydrogen. According to an embodiment of the present invention, after the silicon nitride layer 27 is formed, annealing is performed on the semiconductor substrate in an atmosphere of ammonia gas to effectively remove the impurities from the silicon nitride layer 27. During annealing 29, the impurities in the silicon nitride layer 27, such as carbon or hydrogen, react with nitrogen or hydrogen decomposed from the ammonia gas supplied as a reaction gas to generate a volatile gas such as $CH_4$, $C_2H_2$, or $NH_3$, effectively removing impurities from the silicon nitride layer 27.

According to embodiments of the present invention, annealing 29 may be performed in a separate RTP chamber other than the deposition chamber used to form the silicon nitride layer 27, but in an aspect of a throughput, after the silicon nitride layer 27 is formed inside a rapid thermal chemical vapor deposition (RTCVD) chamber including the RTP apparatus, the process can be performed in-situ.

The steps of forming the silicon nitride layer 27 (step 107) and annealing 29 the semiconductor substrate having the silicon nitride layer 27 (step 109) can be repeated at least twice. In the case that the silicon nitride layer 27 has a thickness equal to or greater than a critical dimension, the impurities in the silicon nitride layer 27 cannot be effectively removed during annealing 29. Hence, the steps of forming the silicon nitride layer 27 to a thickness equal to or less than a critical dimension (step 107) and annealing 29 (step 109) can be repeated until a final silicon nitride layer is formed to a desired thickness to effectively remove the impurities. For example, the silicon nitride layer 27 formed during each process of forming the silicon nitride layer may be formed to a thickness of about 50 Å to about 300 Å.

Figure 5:
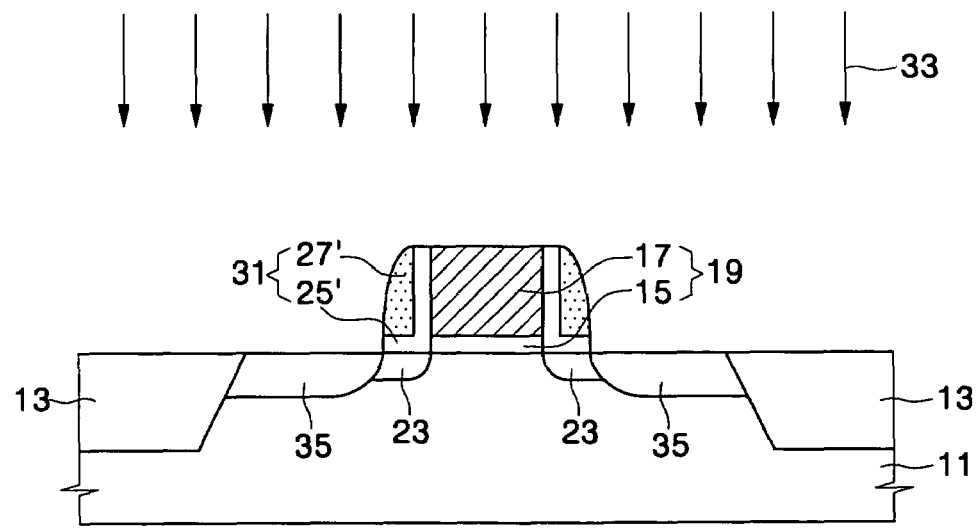
Figure 6:
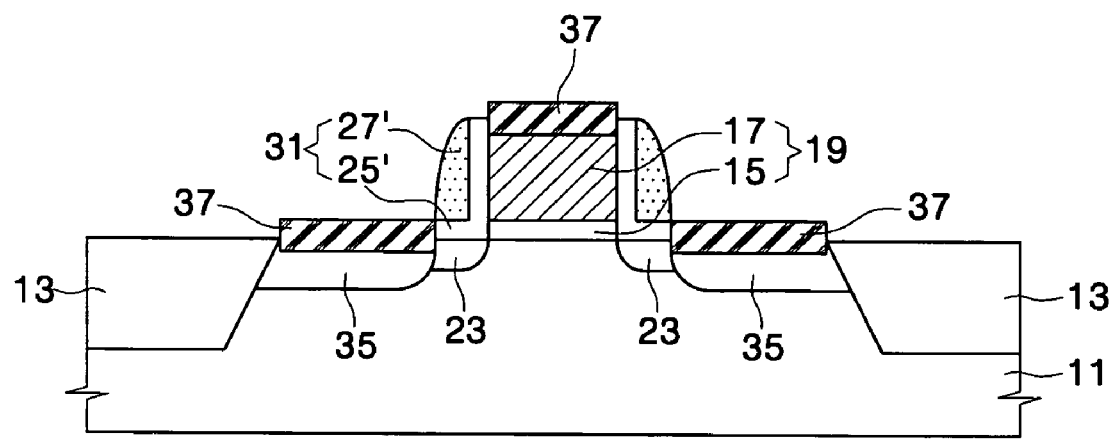

Referring to FIGS. 1 and 5, after annealing 29 is performed to remove impurities from the silicon nitride layer 27, the silicon nitride layer 27 and the silicon oxide layer 25 are anisotropically etched, forming a gate spacer 31 covering the sidewalls of the gate pattern 19, in a step 111. As a result, the gate spacer 31 is formed to include an oxide layer spacer 25' and a nitride layer spacer 27' covering the sidewalls of the gate pattern 19. After the anisotropic etching, the silicon oxide layer 25 having a predetermined thickness remains on the gate pattern 19 and the semiconductor substrate 11. The remaining silicon oxide layer 25 can be removed using a wet etch employing an etch solution including, for example, fluoric acid (HF).

After the gate spacer 31 is formed, second impurity ions 33 are implanted into the semiconductor substrate 11 using the gate pattern 19 and the gate spacer 31 as ion implantation masks, forming source/drain regions 35, in a step 113. The source/drain regions 35 are formed by implanting impurity ions having the same conductivity type as that of the low-concentration impurity regions 23. The source/drain regions 35 are formed to have an impurity concentration higher than that of the low-concentration impurity regions 23. As a result, LDD type source/drain regions are formed on both sides of the gate pattern 19. After the ion implantation process of forming the source/drain regions 35, annealing is performed to activate the impurity ions in the source/drain regions 35.

Referring to FIGS. 1 and 7, after the source/drain regions 35 are formed, a conventional salicide process is performed, forming metal silicide layers 37 on the gate electrode 17 and on the source/drain regions 35, in a step 115. For example, the metal silicide layers 37 may be formed of a cobalt silicide layer, a tantalum silicide layer, a tungsten silicide layer, or a nickel silicide layer.

As described above, according to the present invention, even though a silicon nitride layer is formed using a silicon precursor including a large amount of carbon and hydrogen such as BTBAS, impurities in the silicon nitride layer can be effectively removed. As a result, adverse effects on a semiconductor device due to the impurities in the silicon nitride layer, such as deterioration of the electrical characteristics of the semiconductor device, can be minimized.

Although the exemplary embodiments of the present invention have been described in detail with reference to the accompanying drawings for the purpose of illustration, it is to be understood that the inventive processes and apparatus are not to be construed as limited thereby. It will be readily apparent to those of reasonable skill in the art that various modifications to the foregoing exemplary embodiments may be made without departing from the scope of the invention as defined by the appended claims, with equivalents of the claims to be included therein.

What is claimed is:

1. A method of fabricating a semiconductor device comprising:
   forming a silicon nitride layer on a semiconductor substrate, the silicon nitride layer being formed using BTBAS as a precursor; and
   annealing the semiconductor substrate having the silicon nitride layer in an atmosphere of ammonia ($NH_3$) gas to remove impurities from the silicon nitride layer.

2. The method according to claim 1, wherein the silicon nitride layer is formed using ammonia gas as a reaction gas.

3. The method according to claim 1, wherein annealing is performed at a temperature of about 600° C. to about 700° C.

4. The method according to claim 1, wherein annealing is performed using a rapid thermal process (RTP) apparatus for about 10 seconds to about 60 seconds.

5. The method according to claim 1, wherein the ammonia gas is flowed over the semiconductor substrate during annealing at a flow rate of about 20 sccm to about 100 sccm.

6. The method according to claim 1, wherein the steps of forming the silicon nitride layer and annealing the semiconductor substrate are performed in-situ.

7. The method according to claim 1, wherein the steps of forming the silicon nitride layer and annealing the semiconductor substrate are repeated at least one time.

8. The method according to claim 7, wherein the thickness of the silicon nitride layer is about 50 Å to about 300 Å.

9. A method of fabricating a semiconductor device comprising:
   forming a gate pattern on a semiconductor substrate;
   forming a silicon nitride layer to conformally cover the semiconductor substrate having the gate pattern, the silicon nitride layer being formed using BTBAS as a precursor;
   annealing the semiconductor substrate having the silicon nitride layer in an atmosphere of ammonia ($NH_3$) gas to remove impurities from the silicon nitride layer; and
   anisotropically etching the silicon nitride layer, forming a nitride layer spacer on sidewalls of the gate pattern.

10. The method according to claim 9, wherein annealing is performed at a temperature of about 600° C. to about 700° C.

11. The method according to claim 9, wherein annealing is performed using a RTP apparatus for about 10 seconds to about 60 seconds.

12. The method according to claim 9, wherein the ammonia gas is flowed over the semiconductor substrate during annealing at a flow rate of about 20 sccm to about 100 sccm.

13. The method according to claim 9, wherein the steps of forming the silicon nitride layer and annealing the semiconductor substrate are performed in-situ.

14. The method according to claim 9, wherein, before forming the nitride layer spacer, the steps of forming the silicon nitride layer and annealing the semiconductor substrate are repeated at least one time.

15. The method according to claim 14, wherein the silicon nitride layer is formed to have a thickness of about 50 Å to about 300 Å.

16. The method according to claim 9, before forming the silicon nitride layer, the method further comprising forming a silicon oxide layer conformally covering the semiconductor substrate having the gate pattern, wherein the silicon nitride layer is conformally formed on the silicon oxide layer.

17. The method according to claim 16, further comprising:
   before forming the silicon oxide layer, implanting impurity ions into the semiconductor substrate using the gate pattern as an ion implantation mask, forming low concentration impurity regions; and
   after forming the nitride layer spacer, implanting impurity ions into the semiconductor substrate using the gate pattern and the nitride layer spacer as ion implantation masks, forming source/drain regions.

18. A method of fabricating a semiconductor device comprising:
   forming a gate pattern on a semiconductor substrate;
   implanting impurity ions into the semiconductor substrate using the gate pattern as an ion implantation mask, forming low concentration impurity regions;
   forming a silicon oxide layer to conformally cover the semiconductor substrate having the gate pattern;
   conformally forming a silicon nitride layer on the silicon oxide layer, the silicon nitride layer being formed using BTBAS as a precursor;
   annealing the semiconductor substrate having the silicon nitride layer in an atmosphere of ammonia ($NH_3$) gas to remove impurities from the silicon nitride layer:
   anisotropically etching overall surfaces of the silicon nitride layer and the silicon oxide layer, forming an oxide layer spacer and a nitride layer spacer sequentially covering sidewalls of the gate pattern;
   implanting impurity ions into the semiconductor substrate using the gate pattern and the spacers as ion implantation masks, forming source/drain regions; and
   selectively forming metal silicide layers on the gate pattern and on the source/drain regions.

19. The method according to claim 18, wherein, before forming the nitride layer spacer, the steps of forming the silicon nitride layer and annealing the semiconductor substrate are repeated at least one time.

* * * * *